United States Patent [19]

Sochor

[11] Patent Number: 4,638,382
[45] Date of Patent: Jan. 20, 1987

[54] PUSH-PULL AMPLIFIER AND METHOD FOR OPERATION, PARTICULARLY RECORDING AMPLIFIER FOR VIDEO TAPE RECORDERS

[75] Inventor: Josef Sochor, Dieburg, Fed. Rep. of Germany

[73] Assignee: Robert Bosch GmbH, Stuttgart, Fed. Rep. of Germany

[21] Appl. No.: 631,845

[22] Filed: Jul. 18, 1984

[30] Foreign Application Priority Data

Jul. 20, 1983 [DE] Fed. Rep. of Germany ....... 3326066

[51] Int. Cl.⁴ ............................................. G11B 5/02
[52] U.S. Cl. .................................................... 360/68
[58] Field of Search ....................... 360/46, 68, 64, 67

[56] References Cited

U.S. PATENT DOCUMENTS

| 3,505,662 | 4/1970 | Hibner | 360/46 |
| 3,512,171 | 5/1970 | Hibner | 360/46 |
| 4,524,396 | 6/1985 | Schulz et al. | 360/67 |
| 4,561,027 | 12/1985 | Sita et al. | 360/46 |

FOREIGN PATENT DOCUMENTS 2023176  5/1970  Fed. Rep. of Germany .

Primary Examiner—Vincent P. Canney
Attorney, Agent, or Firm—Frishauf, Holtz, Goodman & Woodward

[57] ABSTRACT

By varying the supply voltage, the output current is adjusted. The push-pull amplifier comprises two branches I, II, each having at least one transistor of the identical conductivity type, the emitters of which are connected with one another and, via a resistor (38, 118), with one pole of the supply voltage source, and the collectors of which are connected with the end terminals (34, 35; 107, 108) of a transformer coil, and one biasing circuit comprising two resistors in a series circuit, the junction points (J1, J2) of which are connected to the bases of the transistors.

The common emitter current is varied virtually exclusively by means of varying the supply voltage, and upon a variation of the supply voltage, the sum of the currents in the two resistor networks are substantially independent of the supply voltage established.

10 Claims, 5 Drawing Figures

PUSH-PULL AMPLIFIER AND METHOD FOR OPERATION, PARTICULARLY RECORDING AMPLIFIER FOR VIDEO TAPE RECORDERS

The present invention relates to a push-pull amplifier, particularly one suitable for amplification of video signals to be recorded by rotating transducer heads positioned on the head wheel of a video transducer for broad-band amplification of signals.

BACKGROUND

In the magnetic storage of broad-band signals, in particular video signals, on magnetic tape, the signals are recorded and read out or reproduced by one or more rotating transducers disposed on the circumference of a head wheel or disk. In the recording mode of operation, the excitation of the transducers must be adjusted to an optimal value, such that in the reproducing mode, a high-frequency output signal at the highest possible level, with the least possible background noise, is produced. Depending on the design and wearing of the transducers, and depending on the type of tape used, the optimized values can vary, necessitating later readjustment.

In German Patent Disclosure Document No. DE-OS No. 32 32 610 to which U.S. Pat. No. 4,524,396, Schulz et al corresponds, of the same Assignee, an amplifier system for a magnetic tape recording and reproduction unit has already been described, in which reproduction transducers, rotating windings of an inductive transformer system and component assemblies of the preamlifiers associated with the reproduction transducers are provided on a rotating disk. Each pre-amplifier has two symmetrical amplifier branches, each having a series circuit comprising a voltage-coupled grounded emitter circuit and grounded collector circut, the outputs of which are connected to the rotating winding of the inductive transformer system. In a further development of this apparatus, the magnetic heads or transducers are provided with a winding having a center tap, which is connected to a fixed voltage. This amplifier system relates, however, to a reproduction preamplifier.

From German Patent Disclosure Document No. 20 23 176, a differential amplifier having two transducers of the same conductivity type is known, the emitters of which are connected to one another forming a quasi-complementary circuit and the bases of which, in a bridge circuit, are connected to the end terminals of a coil having a center tap. The bases of the quasi-complementary transistor pair are cross-connected to the collectors via capacitors. The properties of an unstable multivibrator are thereby supposed to be imparted to the differential amplifier. By decreasing the conductivity of one transistor, an increase in the voltage at the base of the other transistor is brought about, resulting in a reduction in the voltage at its collector. This transferred via the other capacitor to the base of the first transistor and its conductivity is decreased still more. This relates, however, to a differential amplifier without power adjustment via the supply voltage.

A differential stage as the first stage results in a high zero-point constancy. A circuit of that kind has the disadvantage that at high input voltages, each of the amplifier stages can be driven up to saturation. If the input voltage subsequently drops abruptly from a high value to a very low value (in analog signals), corresponding to a 1/0 transition in digital signals, the result is a dead period as a consequence of charge carrier storage effects in the saturated transistors.

In differential amplifiers having two bipolar transistors, the input impedance is relatively low. The difference between the current amplification factors can amount to from 10 to 20%. This necessitates provisions for reducing the imbalance.

THE INVENTION

It is an object of the present invention to provide a push-pull amplifier which is especially suitable for recording video signals by video tape recorders, and which provides for broad-band amplification of signals in which the operating point of two branches of the push-pull amplifiers can be readily controlled.

Briefly, the push-pull amplifier has two branches, each including a transistor of the same conductivity type. A source of electrical power is provided. The transistors of the branches of the push-pull circuit have their emitters connected together and connected, through a common resistor, to one terminal of the power source. Each one of the transistors in a branch has its base connected to a junction of the series resistor circuit. The end terminal of the series resistor circuits is connected to the other terminal of the power source and to the commonly connected emitters of the transistors which, as noted, are connected to the other terminal of the power source through the common emitter resistor. The end terminals of a magnetic transducer recording coil are coupled to the collectors of the transistors of the respective branches.

In accordance with a feature of the invention, the common emitter current is determined by changing the supply voltage to the resistance networks. In accordance with a preferred feature of the invention, the transistors operate as switching transistors, each one being either in fully conductive or fully blocked or saturated condition.

By varying the supply voltage, the output current can be adjusted within wide limits. The push-pull amplifier in accordance with the invention has the advantage that the number of connection points is descreased, and thus fewer transformer devices are needed between the fixed and the rotating parts of the magnetic tape recorder are needed when the devices are disposed on the rotating head wheel. The invention has the further advantage that the amplifier power can be designed for a considerably lower level than in previous amplifiers. A still further advantage is that by reducing the wiring capacity, the recording amplifier can have a higher output resistance.

It is particularly advantageous that because of the low amplifier power of the push-pull amplifier required, and because of the special three-dimensional disposition of the amplifier devices for recording and reproduction of the rotating head wheel, cross talk between the circuits for recording and reproduction is reduced. Finally, it is also advantageous that the recording amplifier can be constructed with relatively few, miniaturized components and is also extremely suitable for integration.

DRAWING

DETAILED DESCRIPTION

Figure 1:
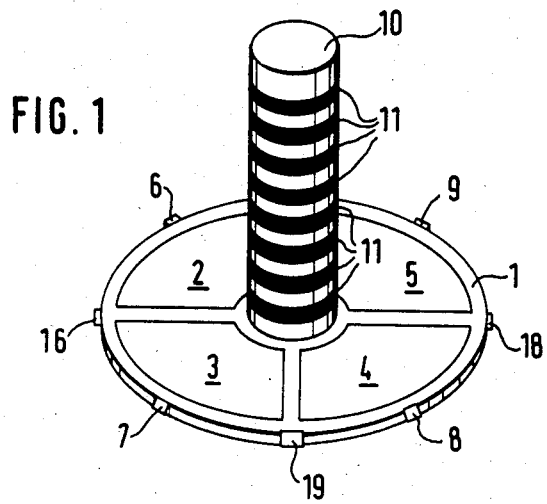
FIG. 1 shows a head wheel with magnetic transducer heads and the rotating part of an inductive transformer system for use in a video magnetic tape recorder, in a plan view seen in perspective.

In FIG. 1, the head wheel of dielectric material is indicated by reference numeral 1. On its upper part, it has amplifier devices on four sectors 2, 3, 4, 5 for supplying the recording transducer heads 6, 7, 8, 9 disposed on the circumference of the head wheel 1. The rotating part 10 of the inductive transformer system is disposed centrally with respect to the axis of rotation of the head wheel 1. The rotating part 10 has a number of transformer coils 11 distributed over its length, each of which is electrically connected with a respective one of the amplifier devices 2–5.

Figure 2:
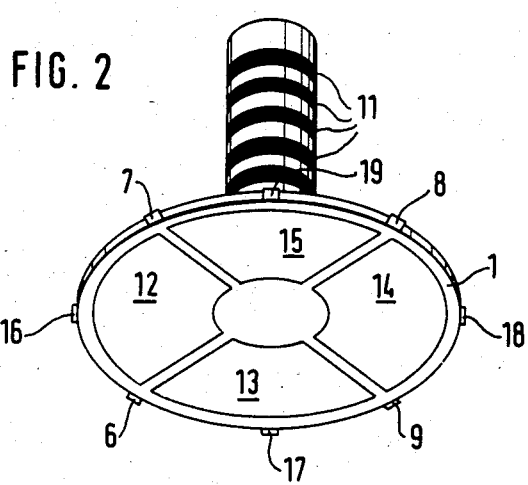
FIG. 2 shows the same head wheel from below, again in perspective.

The head wheel 1 also has four reproducing amplifiers 12, 13, 14, 15 (see FIG. 2) distributed in four segments on its underside, each being electrically conductively connected to a respective one of the reproducing transducer heads 16, 17, 18, 19 secured at equidistant intervals on the circumference of the head wheel 1. Each reproducing amplifier is coupled in a suitable manner with a transformer device 11. The transformer devices 11 may be parts of an inductive transformer for transmitting high-frequency signals from the rotating head wheel to the fixed portion of the magnetic tape recorder (not shown, and for instance of standard, well-known construction); alternatively, they may be slip ring arrangements for transforming the supply voltage.

Figure 3:
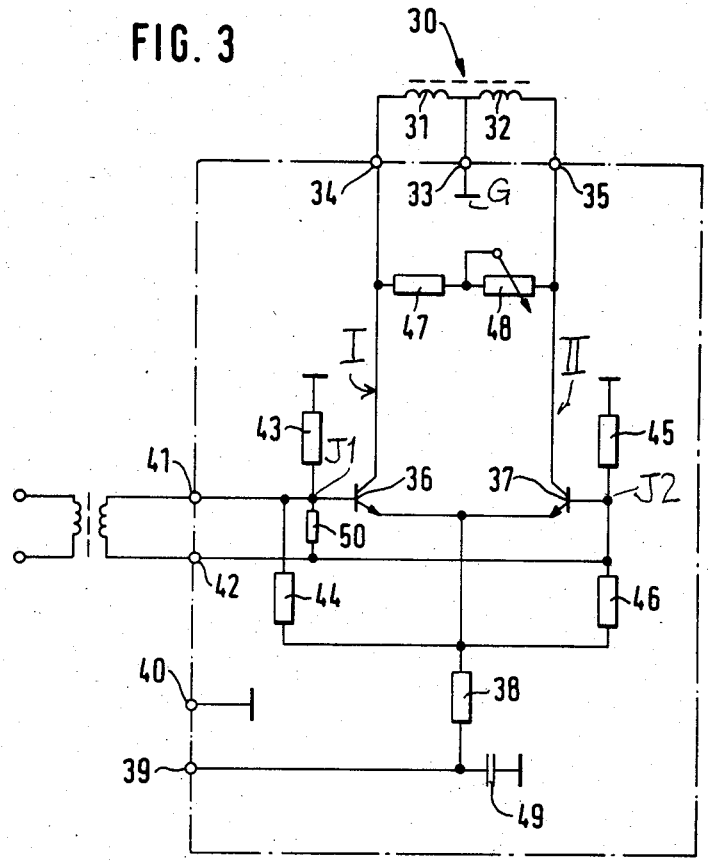
FIG. 3 is the circuit diagram of a recording amplifier for low-frequency application, e.g., audio.

FIG. 3 shows an exemplary embodiment of the recording amplifier a magnetic transducer head has an induction coil 30 which is divided between two partial coils, thereby producing a symmetrical magnetic transducer head. The central terminal 33 of the transducer coil 30 is connected to fixed voltage, e.g. ground G, or chassis, while the outer terminal 34 is connected to the collector of a transistor 36. In the same manner, the outer terminal 35 of the transducer induction coil 30 is connected to the collector of the transistor 37, thus forming two branches I and II. The emitters of the transistors 36, 37 are connected in common, via the resistor 38 at the terminal point 39, with one pole of the voltage source or power supply, while the terminal point 40 is connected to fixed or reference voltage, e.g. ground, or chassis. The two transistors 36, 37 form a push-pull amplifier stage, the bases of which are each connected to one terminal 41, 42 of the rotating transformer for transmitting the signals. Via the resistor 43, the base of the transistor 36 is connected via junction J1 to fixed or reference voltage, while the resistor 44 is located parallel to the base-emitter path of the transistor 36. The resistors 43, 44 connected in series, with junction J1, represent a biasing circuit for the transistor 36, for fixing the operating point. In the same manner, via the resistor 45 and junction J2, the base of the transistor 37 is applied to fixed voltage, while the resistor 46 in series therewith is located parallel to the base-emitter path of the transistor 37. The resistor combination 47, 48, as a series circuit of the fixed resistor 47 and the adjustable resistor 48 between the two collectors of the transistors 36, 37, serves to adjust the rise times of the recording current. The capacitor 49 diverts interference voltage peaks, which can travel from the voltage source at the terminal 39 and reach the amplifier circuit, to ground. The resistor 50, which connects the two bases of the transistors 36, 37 with one another, serves as a terminating resistor of the rotating transformer.

OPERATION

As a result of the voltage drop of the base-emitter path of the two transistors 36, 37, which is substantially independent of the maximum collector current, it is essentially only the collector current of the two transistors 36 and 37 which varies if there is a variation in the supply voltage. The amplifier apparatus described herein makes it possible to adjust the operating current of the recording amplifier merely by varying the supply voltage. To avoid temperature sensitivity on the part of the overall circuit, a further resistor having a substantially smaller resistance value than that of resistor 38 can be disposed between the common emitter and the junction point of the resistors 38, 44.

Figure 4:
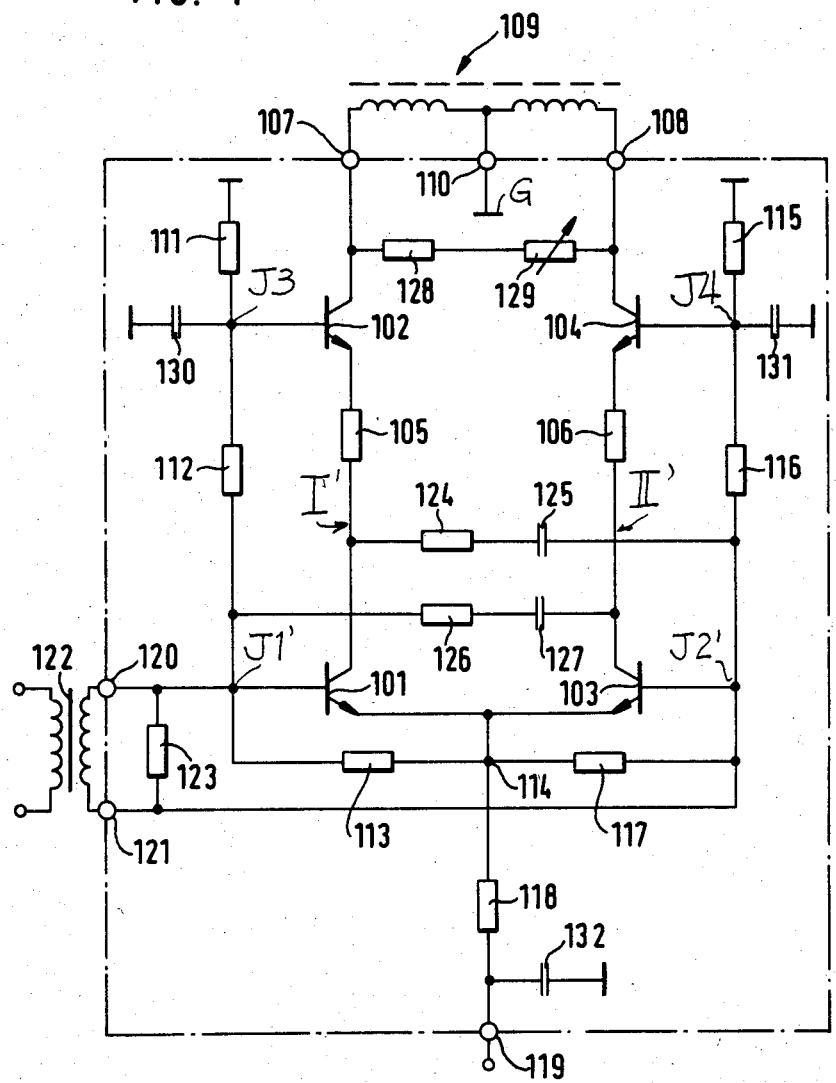
FIG. 4 is the circuit diagram of a recording amplifier for the video frequency range.

The circuit layout of FIG. 4 represents a recording amplifier for processing broad-band signals, in particular digital video signals. Each branch I', II' of the push-pull amplifier comprises two transistors 101, 102 and 103, 104, respectively, in a cascade connection. The collectors of the pre-amplifying transistors 101 and 103, respectively, are connected via respective resistors 105 and 106 with the emitters of the following driver transistors 102 and 104. The collectors of the transistors 102, 104 are connected with the end terminals 107 and 108 of the transducer coil 109. The central tap of the transducer induction coil 109 of the magnetic transducer head (not shown) is connected to fixed voltage G via the junction or tap point 110. The base of the transistor 102 is connected via the resistor 111 to fixed voltage J3, while via the resistor 112 it is connected with the junction J1' and the base of the transistor 101, and by means of the resistor 113 connected in series with the resistor 112, it is connected with the common tap 114 of the emitters of the two transistors 101, 103. In the other amplifier branch II', the base of the transistor 104 is connected via the resistor 115 to fixed voltage J4 and is connected via the resistor 116 with the junction J2' and the base of the transistor 103. The biasing resistor 117 is located parallel to the base-emitter path of the transistor 103. The common tap 114 of the two emitters of the transistors 101, 103 is connected via the resistor 118 to the supply voltage point 119. The bases of the two transistors 101, 103 are connected with the two tap points 120, 121 of the inductive transformer system 122 for feeding in the signals that are to be transmitted. A resistor 123 connects the two tap points 120, 121 and serves as a terminating resistor of the transformer 122.

OPERATION

The biasing circuits and comprising the resistors 111, 112, 113 and 115, 116, 117, respectively, effect the biasing of the respective base-emitter paths of the transistors 101-104 in such a manner that the operating current flowing through the transistor cascades depends on the level of the supply current at the tap point 119. In this manner, the optimal operating current can be adjusted by varying the supply voltage at the tap point 119.

As an aid to charge carrier reversal for the transistor cascades comprising the transistors 101, 102 and 103, 104, the networks each comprising a series circuit of a resistor and a capacitor, and connecting the collectors of the transistors 101, 103 crosswise with their bases, are provided for processing broad-band signals. The series circuit comprising the resistor 124 and the capacitor 125 is provided between the base of the transistor 103 and the collector of the transistor 101, while the collector of the transistor 103 is connected with the base of the transistor 101 by means of the series circuit comprising the resistor 126 and the capacitor 127. By the selection of the resistance values for the resistors 124, 126, it is possible to provide that if the conductivity of one transistor is reduced, the voltage at the base of the other transistor is increased and that at its collector is decreased. This reduction is fed back in accordance with alternating voltage, via the network parallel to it, to the base of the first transistor, and the conductivity of that transistor is then reduced still further. For alternating-voltage decoupling of the bases of the transistors 102, 104, these transistors are connected via respective capacitors 130, 131 to fixed voltage. It is thereby assured that the transistors 102, 104 will further amplify the signals from the collectors of the transistors 101, 103 with an unchanging amplification factor.

Figure 5A:
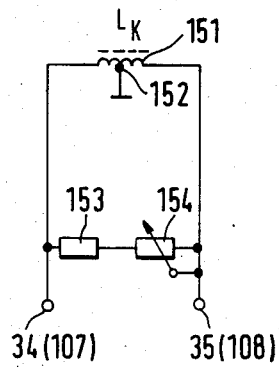
FIGS. 5a–5d show various realizations of the coupling of the amplifier of FIG. 3 or FIG. 4 to the induction coil of the magnetic transducer.
Figure 5B:
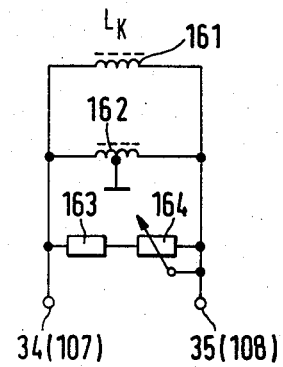
Figure 5C:
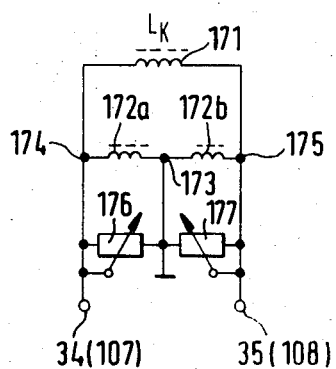
Figure 5D:
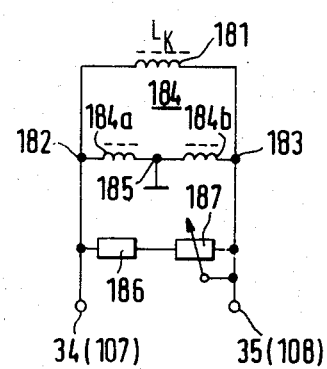

In FIGS. 5a–5d, various possibilities are shown for coupling the induction coil LK, corresponding to coil 30, FIG. 3 or 109, FIG. 4) to the tap points 34, 35 (FIG. 3) or 107, 108 (FIG. 4) of the recording amplifier in accordance with the invention. FIG. 5a corresponds to what is shown in FIGS. 3 and 4. The induction coil 151 is provided with a central tap 152 for the purpose of making it symmetrical, and a series circuit comprising the fixed resistor 153 and an adjustable resistor 154 is connected parallel to the end terminals of the induction coil 151, in order to calibrate the overall system. In FIG. 5b, the induction coil 161 is formed without a central tap; instead, for providing symmetry, an inductance 162 is located parallel to the induction coil 161, and parallel to that is the calibration network 163, 164 comprising a series circuit of one fixed resistor 163 and one adjustable resistor 164. The inductance of the coil 162 is selected to be much greater than the inductance of the transducer induction coil 161. In FIG. 5c, the induction coil 171 of the magnetic transformer is likewise formed without a central tap, and for purposes of symmetry the central tap of the induction coil 172 located parallel to the induction coil 171 is divided into two partial coils 172a and 172b, with the common tap 173 being connected to fixed voltage. Between the common tap and the end terminals 174 and 175, two adjustable resistors 176 and 177 are provided for symmetry and calibration of the overall system. In this case again, the inductance of the coil arrangement 172 is designed to be much greater than that of the transducer coil 171. Finally, according to FIG. 5d, the transducer coil 181 is again formed in an undivided manner. Parallel to its end terminals 182, 183 there is an overall inductance 184 comprising the two partial inductances 184a, 184b, the central tap of which is located parallel to the partial two inductances 184a and 184b, and a calibration network comprising the series circuit of the fixed resistor 186 and the adjustable resistor 187 is connected with a common tap joining 184a, 184b and 186, 187 to fixed voltage.

The selection of the various embodiments shown in FIG. 5 depends primarily on the availability of the various component elements, and in particular on whether the induction coils of the magnetic transducers are formed with a central tap, or not.

In one practical exemplary embodiment of a recording amplifier according to FIG. 3, the components used have the following specifications:
Transistors 36, 37: Type BFQ 29 (64)
Resistors 43, 45: 3, 3 k
Resistors 44, 46, 47: 220
Resistor 38: 51
Resistor 50: 39
Resistor 48: 1 k
Capacitor 49: 100 n.

In a practically realized example of an amplifier for processing broad-band signals, in particular video signals, the components used have the following properties:
Transistors 101, 103: Type BFQ 29
Transistors 102, 104: Type BFQ 64
Resistors 105, 106: 22
Resistors 111, 115: 3, 3 k
Resistors 112, 116: 680
Resistors 113, 117: 220
Resistor 118: 39
Resistor 123: 39
Resistors 124, 126: 100
Resistor 128: 220
Resistor 129: 1 k
Capacitors 125, 127, 130, 131, 132: 100 n.

In dimensioning the amplifier circuit corresponding to FIG. 3 or FIG. 4, it should be assured by the appropriate selection of the resistance values of the resistors 43, 44 or 111, 115, respectively, that at maximum current the minimum collector-base voltage of the transistor 36, 37 or 102, 104 does not fall below approximately 1 V, so as to avoid saturation effects, with the charge carrier reversal delays associated with them, because otherwise the circuit becomes unsuitable for high-frequency use.

The base emitter path of the transistors 101, 103, respectively, causes a voltage drop in the order of between 0.6 ... 0.7 volt, depending on the respective type of transistor. This voltage drop will cause a current in the resistors 113, 117, respectively, parallel to the base emitter paths of:

$$I_1 = (0.6 \ldots 0.7 \text{ V})/R\ 113,$$

or, respectively, $$I_2 = (0.6 \ldots 0.7 \text{ V})/R\ 117$$

If one neglects the base currents, the same currents will therefore flow in the resistors 111, 112 or 115, 116, respectively, as in the resistors 113, 117, respectively, One may, therefore, say that the currents in the resistance networks 111, 112, 113, or 115, 116, 117, respectively, are essentially independent on the level of the supply voltage applied to the point 119.

If always essentially the same current flows in the resistors 11, 112, 113, or 115, 116, 117, respectively, and if the resistance values, which are fixed, are always the same, if follows that the junction 114 will always essentially be on the same voltage level. If the voltage level at the supply point 119 varies, different currents will flow in resistor 118, dependent on the voltage difference between the points 119 and 114. Since, as above described, essentially always the same currents flow in the resistance networks, the currents will change in the collector-emitter paths of the transistors 101, 102, 103, 104. Thus, the desired current adjustment is obtained only by variation of the supply voltage at point 119.

What is claimed is:

1. A video head wheel-recording transducer-recording amplifier combination having
a rotatable head wheel (1);
at least one transducer head (6, 7, 8, 9), each having a transducer coil (30, 109, $L_K$) and end terminals (34, 35; 107, 108) located on the rotating head wheel;
a plurality of rotating electrical transmission elements (11) on the head wheel, forming part of electrical transfer paths for transferring electrical energy between the rotating head wheel and stationary components;
and at least one push-pull transistor amplifier located on the rotatable head wheel,
wherein the transistor push-pull amplifier comprises a push-pull amplifier circuit which has a minimum number of electrical transfer paths between the rotating head wheel on the stationary component and is characterized by a circuit configuration which determines the operating point of the transistors of the transistor amplifier by control of the voltage of a power source, coupling power via power connection sections of the electrical transfer paths to the transistor push-pull amplifier,
said transistor push-pull amplifier circuit comprising two branches (I, II; I', II') each including a transistor (36, 37; 101, 102, 103, 104) of identical conductivity type;
a common resistor (38, 118) having a first and a second terminal,
the emitters of both transistors of the two branches (I, II) being connected together and to the first terminal of said common resistor only, and the second terminal of the common resistor being connected to one terminal (39, 119) of the power connection section of the transfer paths;
two resistor circuits, each having at least two resistors (43, 44, 45, 46; 112, 113, 116, 117), and a common junction or tap point (J1, J2, J1', J2'; J3, J4) connecting said at least two resistors of the two resistor series circuits,
each resistor series circuit having one end terminal connected to the other terminal (40, 110) of the power connection section transfer paths including the head wheel, and another end terminal connected to said one terminal of the common resistor (39, 118) and hence to the emitters of the transistors (36, 37; 101, 102, 103, 104) of the two branches (I, II; I', II');
a connection between the junctions or tap points of each of the resistor series circuits of a transistor in a respective branch (I, II; I', II'); and
wherein the end terminals (34, 35; 107, 108) of the transducer coil are coupled to respective collectors of the transistors in the respective branches.

2. The combination of claim 1 wherein a plurality of push-pull transistor amplifiers are provided, each located on the same side of the rotating head wheel, and connected to a respective transducer;
and reproducing circuit elements are provided, located at the opposite side of the wheel.

3. The combination of claim 1 wherein the push-pull transistors amplifiers comprise a cascode circuit in each branch (I',II') of the push-pull amplifier, and each cascode circuit comprises two transistors (101, 102; 103, 104) each being of identical conductivity type.

4. The combination of claim 3 wherein one (102, 104) of the transistors forms a driver transistor, having its collector connected to the end terminals (107,108) of the transducer coil (109), and the other transistors forms a biasing transistor (101,103);
and wherein, in order to reduce the charge carrier reversal times of the transistors and to improve the symmetrical properties between the collectors of the biasing transistors (101,103) and the emitters of the driver transistors (102, 104), a coupling resistor (105, 106) is connected between the collector of the biasing transistor of one branch and the emitter of the driver transistor (102, 104) of same branch;
and two resistor-capacitor networks (124, 125; 126, 127) are provided, each including a series resistor-capacitor network, said series-capacitor network being connected between the collector of the biasing transistor (101, 103) of one branch (I', II') and the base of the biasing transistor (103, 101) of the opposite branch is provided.

5. A recording transducer-recording amplifier combination having
at least one transducer head (6, 7, 8, 9) each having a transducer coil (30, 109) $L_K$ with end terminals (34, 35; 107, 108);
a plurality of terminals forming part of electrical transfer paths for transferring electrical energy between the recording transducer-recording amplifier combination and external circuit components; and
at least one push-pull transistor amplifier,
wherein said recording transducer-recording amplifier combination has a minimum number of terminals and electrical transfer paths, and the transistor push-pull amplifier comprises a push-pull amplifier circuit which is characterized by controlling the operating points of a transistor of a transistor amplifier by control of the voltage of a power source coupled to said recording transducer-recording amplifier combination via power connection sections of the electrical transfer paths,
said transistor amplifier circuit comprising two branches (I, II; I', II'), each including a transistor (36, 37; 101, 102, 103, 104) of identical conductivity;
a common resistor (39, 118) having a first and a second terminal,
the emitters of both transistors of the two branches (I, II) being connected together and to the first terminal of said common resistor only, and the second terminal of the common resistor being connected to one terminal (39, 119) of the power connection section of the transfer paths;
two resistor circuits, each having at least two resistors (43, 44, 45, 46; 112, 113, 116, 117) and a common junction or tap point (J1, J2; J1', J2'; J3, J4) connecting said at least two resistors of the two resistor series circuits,
each resistor series circuit having one end terminal connected to the other terminal (40, 110) of the power connection section of the transfer paths and another end terminal connected to said one terminal of the common resistor (38, 118) and hence to the emitters of the transistors of the two branches (I, II; I', II')
a connection between the junctions or tap points of each of the resistor series circuits of a transistor in a respective branch (I, II; I', II'); and wherein the end terminals (34, 35; 107, 108) of the transducer coil are coupled to respective collectors of the transistors in the respective branches.

6. The combination of claim 5 wherein the push-pull transistor amplifiers comprise a cascode circuit in each branch (I′, II′) of the push-pull amplifier, and each cascode circuit comprises two transistors (101, 102; 103, 104) each being of identical conductivity type.

7. The combination of claim 5 wherein one (102, 104) of the transistors forms a driver transistor, having its collector connected to the end terminals (107,108) of the transducer coil (109), and the other transistor forms a biasing transistor (101,103);

and wherein, in order to reduce the charge carrier reversal times of the transistors and to improve the symmetrical properties between the collectors of the biasing transistors (101,103) and the emitters of the driver transistors (102, 104), a coupling resistor (105, 106) is connected between the collector of the biasing transistor of one branch and the emitter of the driver transistor (102, 104) of said same branch;

and two resistor-capacitor networks (124, 125; 126, 127) are provided, each including a series resistor-capacitor network, said series-capacitor network being connected between the collector of the biasing transistor (101, 103) of one branch (I′, II′) and tne base of the biasing transistor (103, 101) of the opposite branch is provided.

8. A recording transducer-recording amplifier combination having at least one transducer head (6, 7, 8, 9) each having a transducer coil (30, 109) $L_K$ with end terminals (34, 35; 107, 108);

a plurality of terminals forming part of electrical transfer paths for transferring electrical energy between the recording transducer-recording amplifier combination and external circuit components; and at least one push-poll transistor amplifier, wherein said recording transducer-recording amplifier combination has a minimum number of terminals and electrical transfer paths, and the transistor push-pull amplifier comprises a push-pull amplifier circuit which is characterized by controlling the operating points of a transistor of a transistor amplifier by control of the voltage of a power source coupled to said recording transducer-recording amplifier combination via power connection sections of the electrical transfer paths, said transistor amplifier circuit comprising two branches (I, II; I′, II′), each including a transistor (36, 37; 101, 102, 103, 104) of identical conductivity;

a common resistor (38, 118) having a first and a second terminal, the emitters of both transistors of the two branches, (I, II) being connected together and to the first terminal of said common resistor only, and the second terminal of the common resistor being connected to one terminal (39, 119) of the power connection section of the transfer paths;

two resistor circuits, each having at least two resistors (43, 44, 45, 46; 112, 113, 116, 117) and a common junction or tap point (J1, J2; J1′, J2′; J3, J4) connecting said at least two resistors of the two resistor series circuits, each resistor series circuit having one end terminal connected to the other terminal (40, 110) of the power connection section of the transfer paths and another end terminal connected to said one terminal of the common resistor (38, 118) and hence to the emitters of the transistors of the two branches (I, II; I′, II′)

a connection between the junctions or tap points of each of the resistor series circuits of a transistors in a respective branch (I, II; I′, II′); and wherein the end terminals (34, 35; 107, 108) of the transducer coil are coupled to respective collectors of the transistors in the respective branches;

and wherein the operating points of the transistors in the respective branches are controlled by controlling the voltage of a power source coupled to the power connection section of the transfer paths.

9. The combination of claim 8 wherein the voltage is controlled to operate the transistors in ON/OFF, or switching mode.

10. A video head wheel carrying said recording transducer-recording amplifier combination as claimed in claim 5 on the head wheel, and wherein said electrical transfer paths include a plurality of rotating electrical transmission elements (11) located on the head wheel, and said external components are stationary, the electrical transmission elements on the head wheel transferring electrical energy between the rotating head wheel and said stationary components and thereby forming part of the electrical transfer paths.

* * * * *